(12) United States Patent
Chou

(10) Patent No.: US 7,025,858 B2
(45) Date of Patent: Apr. 11, 2006

(54) APPARATUS FOR SUPPORTING WAFER IN SEMICONDUCTOR PROCESS

(76) Inventor: Chung-Yen Chou, No. 9, Li-Hsin Road, Science-Based Industrial Hsin-Chu (TW)

(*) Notice: Subject to any disclaimer, the term of this patent is extended or adjusted under 35 U.S.C. 154(b) by 232 days.

(21) Appl. No.: 10/378,230

(22) Filed: Mar. 3, 2003

(65) Prior Publication Data
US 2004/0173318 A1  Sep. 9, 2004

(51) Int. Cl.
*H01L 21/00* (2006.01)
*C23C 16/00* (2006.01)

(52) U.S. Cl. ............ 156/915; 156/345.51; 156/345.52; 156/345.53; 118/715; 118/728; 118/725; 118/724; 204/298.01; 204/192.1; 216/67; 279/128; 361/234; 438/710

(58) Field of Classification Search ............... 156/915, 156/345.51, 345.52, 345.53; 118/715, 728, 118/725, 724; 204/298.01, 192.1; 216/67; 279/128; 361/234; 438/710
See application file for complete search history.

(56) References Cited

U.S. PATENT DOCUMENTS 6,039,836 A * 3/2000 Dhindsa et al. .......... 156/345.1
6,079,426 A * 6/2000 Subrahmanyam et al. ... 134/1.1
6,363,882 B1 * 4/2002 Hao et al. ................. 118/723 E
6,383,931 B1 * 5/2002 Flanner et al. .............. 438/689
6,489,249 B1 * 12/2002 Mathad et al. .............. 438/729
2004/0074605 A1 * 4/2004 Nezu et al. ............ 156/345.47

FOREIGN PATENT DOCUMENTS

JP         02011781 A   *   1/1990

* cited by examiner

*Primary Examiner*—Ram N Kackar
(74) *Attorney, Agent, or Firm*—Clement Cheng

(57) ABSTRACT

The present invention provides an apparatus for supporting a wafer in a semiconductor process. The apparatus includes an electrostatic chuck, a focus ring and a conductive material. The electrostatic chuck has a first fillister in its periphery. When a DC power is applied to the electrostatic chuck, the wafer is attached tightly to the electrostatic chuck by electromagnetic force. The focus ring has a second fillister opposite to the first fillister, and the focus ring is fixed on the periphery of the electrostatic chuck. The conductive material is located below the focus ring, and the conductive material is moving between the first fillister and the second fillister by a drive apparatus. When the conductive material is moving close to the focus ring in semiconductor etching process, it can improve the etching uniformity of the wafer periphery.

18 Claims, 1 Drawing Sheet

APPARATUS FOR SUPPORTING WAFER IN SEMICONDUCTOR PROCESS

BACKGROUND OF THE INVENTION

1. Field of the Invention

This invention generally relates to the field of an apparatus for supporting a wafer. More particularly, the present invention relates to an apparatus with a conductive material that moves inside a focus ring to improve the uniformity of the wafer edge plasma in the etching process.

2. Description of the Prior Art

The integrated circuits have been not only used anywhere in our daily life but also applied to computer industry, communication industry, and electronic consumer products. The process flows of making the integrated circuits are complicated and include hundreds of steps, such as deposition, photolithography, etching, diffusion, ion implantation, oxidation, thermal treatment process, etc. These processes will take about more than one or two months.

In addition, when the etching process proceeds, a focus ring is designed nearby an electrostatic chuck of a supporting apparatus to keep the quality of the etching uniformity of the wafer periphery. Most of the focus rings are made of quartz or Vespel consisting of polyimide. However, the material or thickness of the focus ring, sometimes, causes the inconsistency of the wafer edge Vdc. This situation leads to the poor uniformity of the wafer edge plasma and causes low energy of ion bombardment. Hence, the wafer may have the poor uniformity on its periphery after the etching process.

FIG. 1 illustrates a well-known apparatus for supporting a wafer in semiconductor process and the apparatus includes an electrostatic chuck 100 and a focus ring 110. The upside surfaces of the electrostatic chuck 100 include an upside surface 120 of a central circle and an upside surface 130 of a first ring edge, wherein a wafer is placed on the upside surface 120 of the central circle. The upside surfaces of the focus ring 110 include an upside surface 150 of a first ring and an upside surface 160 of a second ring, wherein the upside surface 150 of the first ring has the same height and is close to the upside surface 120 of the central circle, and a bottom 140 of the focus ring 110 is fixed on the upside surface 130 of the electrostatic chuck 100.

When a wafer 170 is placed on the upside surface 120 of the central circle of the electrostatic chuck 100, the wafer 170 is attached to the upside surface 120 of the central circle by applying DC power to the electrostatic chuck 100 to generate electromagnetic force. The ion energy of plasma beams 180 above the wafer 170 is stronger than those above the upside surfaces 150 and 160 because of the material and thickness of the focus ring 110 when a 1500~2500 Vdc and a RF power are applied to generate a self-bias voltage. This affects the uniformity of the wafer 170 edge Vdc, leading to the inconsistency of the wafer 170 edge plasma and making the ion bombardment different energy, and then produces the poor uniformity of the wafer 170.

SUMMARY OF THE INVENTION

According to the shortcomings mentioned in the background, the present invention provides an apparatus to improve the foregoing drawbacks.

Accordingly, one object of the present invention is to provide an apparatus for supporting wafer in semiconductor process for improving the etching uniformity of the wafer periphery.

Another object is to provide a conductive material for making the energy of plasma ion uniformly spread above the wafer to improve the etching uniformity of the wafer periphery.

According to the objects mentioned above, the present invention provides an apparatus for supporting wafer, including: an electrostatic chuck, a focus ring and a conductive material. The electrostatic chuck has a first fillister in its periphery. When a DC power is applied to the electrostatic chuck, the wafer is attached tightly to the electrostatic chuck by electromagnetic force. The focus ring has a second fillister opposite to the first fillister, and the focus ring is fixed on the periphery of the electrostatic chuck. The conductive material is located below the focus ring, and the conductive material is moving between the first fillister and the second fillister by a drive apparatus. When the conductive material is moving close to the focus ring in semiconductor etching process, it can improve the etching uniformity of the wafer periphery.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The preferred embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

In accordance with the present invention, an apparatus for supporting a wafer in the semiconductor process, including an electrostatic chuck, a focus ring, and a conductive material. The electrostatic chuck is used in attaching a wafer during the etching process. The focus ring is used in keeping the quality of the etching uniformity of the wafer periphery. The conductive material is used in improving the etching uniformity of the wafer periphery. Herein, the conductive material is located below the focus ring of the apparatus for supporting the wafer in order to improve the plasma uniformity of the wafer periphery. By doing so, the energy of plasma ion can be uniformly spread above the wafer.

Figure 1:
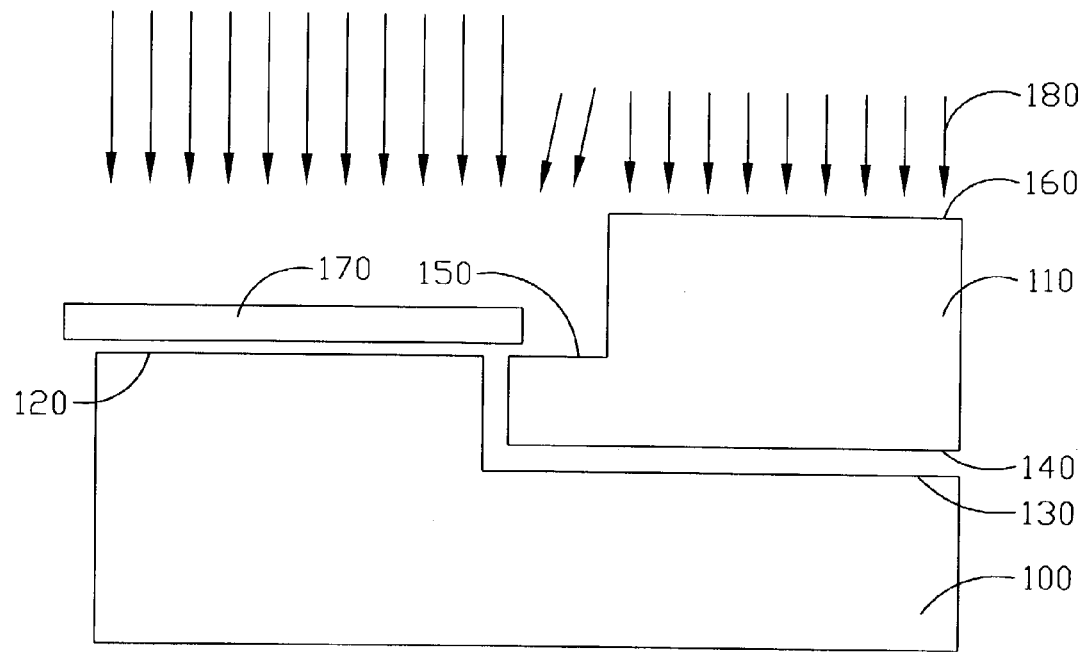
FIG. 1 is a well-known apparatus for supporting the wafer in the semiconductor process.
Figure 2:
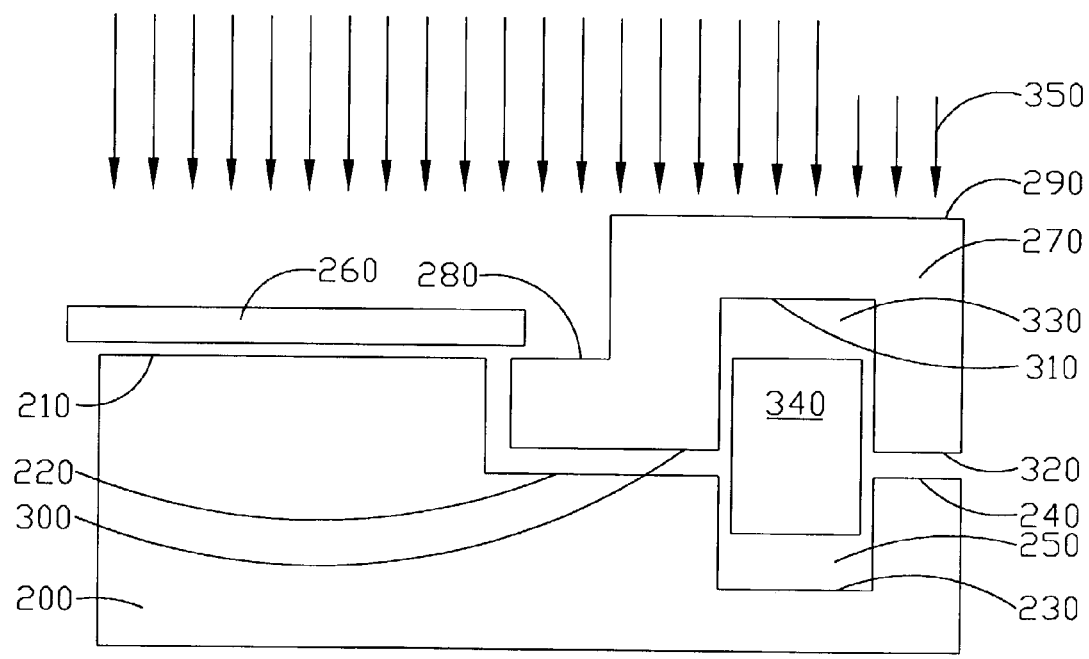
FIG. 2 shows the apparatus in accordance with the present invention for supporting the wafer in the semiconductor process.

FIG. 2 illustrates the preferred embodiment of the apparatus in accordance with the present invention for supporting a wafer. The apparatus includes an electrostatic chuck 200, a focus ring 270, and a conductive material 340. The upside surfaces of the electrostatic chuck 200 include an upside surface 210 of a central circle, an upside surface 220 of a first ring edge, an upside surface 230 of a second ring edge, and an upside surface 240 of a third ring edge. The height of the upside surface 210 of the central circle is higher than the height of the upside surface 220 of the first ring edge and the upside surface 240 of the third ring edge, and the height of the upside surface 220 of the first ring edge is equal to the height of the upside surface 240 of the third ring edge, but is higher than the upside surface 230 of the second ring edge to form a first fillister 250 on the upside surface 230 of the second ring edge. When a wafer 260 is placed on the upside surface 210 of the central circle of the electrostatic chuck 200, the wafer 260 is attached to the upside surface 210 of the central circle by applying a DC power to the electrostatic chuck 200 to generate electromagnetic force, moreover, the self-bias by turning on the RF power can accelerate the speed of plasma toward the wafer 260.

The upside surfaces of the focus ring 270 include an upside surface 280 of a first ring and an upside surface 290 of a second ring. The upside surface 280 of the first ring has the same height and is close to the upside surface 210 of the central circle of the electrostatic chuck 200, wherein the upside surface 290 of the second ring is higher than the upside surface 280 of the first ring. Moreover, the edge of the upside surface 290 of the second ring aims at the edge of the upside surface 240 of the second ring edge of the electrostatic chuck 200. The focus ring 270 also includes a downside surface 300 of a first ring, a downside surface 310 of a second ring, and a downside surface 320 of a third ring. The height of the downside surface 300 of the first ring is equal to the height of the downside surface 320 of the third ring, but is lower than the height of downside surface 310 of the second ring to form a second fillister 330 under the downside surface 310 of the second ring. Moreover, the downside surfaces 300 of the first ring and the downside surface 320 of the third ring are above the upside surface 220 of the first ring edge and the upside surface 240 of the third ring edge of the electrostatic chuck 200, making the inside surfaces of the second fillister 330 aim to the inside surfaces of the first fillister 250. The focus ring can be made of quartz, silicon, ceramics or Vespel consisting of polyimide.

The ion energy of plasma beams 350 above the wafer 260 is stronger than those above the upside surfaces 280 and 290 because of the material and thickness of the focus ring 270 when a RF power is applied to generate a self-bias voltage. This affects the uniformity of the wafer 260 edge Vdc, leading to the inconsistency of the wafer 260 edge plasma and making the ion bombardment different energy, which then produces the poor uniformity of the wafer 260. Hence, the present invention provides the conductive material 340 located below the focus ring 270 for improving the plasma uniformity of the wafer 260 periphery during the etching process. The ion energy of plasma above the wafer 260 can be uniformly separated because of the conductive design of the conductive material 340.

The conductive material 340 can be made of silicon, carbon or aluminum. A driver device, step motor, controls the moves of the conductive material 340. The conductive material 340 moves between the first fillister 250 and the second fillister 330, so that the Vdc can be adjusted. In other words, the energy of ion bombardment above the conductive material 340 will increase when the conductive material moves up. By adjusting the position of the conductive material 340 can achieve the uniformity of the plasma energy form the wafer 260 center to its periphery. Besides, various shapes of the conductive material can be designed to get the uniformity of the plasma energy. Generally speaking, the uniformity of the wafer 260 periphery can be improved by adjusting the parameters of the etching process, changing the focus ring 270, or changing the shape of the conductive material 340.

Therefore, the advantage of the present invention is: the uniformity of plasma around the wafer periphery can be improved by moving the conductive material, which is located below the focus ring and is controlled by the step motor, toward the focus ring. This process makes the best uniformity in the etching process.

Although specific embodiments have been illustrated and described, it will be obvious to those skilled in the art that various modifications may be made without departing from what is intended to be limited solely by the appended claims.

What is claimed is:

1. An apparatus for supporting a wafer in a semiconductor process, said apparatus comprising:
    an electrostatic chuck, said electrostatic chuck having a first fillister in its periphery, wherein the wafer is attached tightly on said electrostatic chuck by electromagnetic force when a DC power is applied to said electrostatic chuck;
    a focus ring, said focus ring being fixed on the periphery of said electrostatic chuck and having a second fillister opposite to said first fillister; and
    a conductive material, said conductive material being located below said focus ring, moving between said first fillister and said second fillister, and being driven by a drive apparatus, wherein the etching uniformity of the wafer periphery can be improved when said conductive material moves close to said focus ring in a semiconductor etching process.

2. The apparatus for supporting the wafer in semiconductor process according to claim 1, wherein said focus ring is made of quartz.

3. The apparatus for supporting the wafer in semiconductor process according to claim 1, wherein said focus ring is made of silicon.

4. The apparatus for supporting the wafer in semiconductor process according to claim 1, wherein said focus ring is made of ceramics.

5. The apparatus for supporting the wafer in semiconductor process according to claim 1, wherein said focus ring is made of polyimide.

6. The apparatus for supporting the wafer in semiconductor process according to claim 1, wherein said conductive material is made of silicon.

7. The apparatus for supporting the wafer in semiconductor process according to claim 1, wherein said conductive material is made of carbon.

8. The apparatus for supporting the wafer in semiconductor process according to claim 1, wherein said conductive material is made of aluminum.

9. The apparatus for supporting the wafer in semiconductor process according to claim 1, wherein said drive apparatus is a step motor.

10. An apparatus for supporting a wafer in semiconductor process, said apparatus comprising:
    an electrostatic chuck, the upside surfaces of said electrostatic chuck include an upside surface of a central circle, an upside surface of a first ring edge, an upside surface of a second ring edge, and an upside surface of a third ring edge, wherein the height of the upside surface of said central circle is higher than the height of the upside surface of said first ring edge and the upside surface of said third ring edge, and the height of upside surface of said first ring edge is equal to the height of the upside surface of said third ring edge, but is higher than the upside surface of said second ring edge to form a first fillister on the upside surface of said second ring edge, wherein a wafer can be placed on the upside surface of said central circle;
    a focus ring, the upside surfaces of said focus ring include an upside surface of a first ring and an upside surface of a second ring, wherein the upside surface of said first ring has the same height and is close to the upside surface of said central circle of said electrostatic chuck, and the upside surface of said second ring is higher than the upside surface of said first ring, moreover, the edge of the upside surface of said second ring aims at the edge of the upside surface of said third ring edge of said electrostatic chuck, wherein said focus ring also include a downside surface of a first ring, a downside surface of a second ring, and a downside surface of a third ring, wherein the height of the downside surface of said first ring is equal to the height of the downside surface of said third ring, but is lower than the downside surface of said second ring to form a second fillister below the downside surface of said second ring, moreover, the downside surface of said first ring and the downside surface of said third ring are above the upside surface of said first ring edge and the upside surface of said third ring edge of said electrostatic chuck, making the inside surfaces of said second fillister aim to the inside surfaces of said first fillister; and a conductive material, whose moving is controlled by a drive apparatus, wherein said conductive material is located below the downside of said second ring of said focus ring, moving between said second fillister and said first fillister, wherein the etching uniformity of the wafer periphery can be improved when said conductive material moves close to said focus ring in a semiconductor etching process.

11. The apparatus for supporting the wafer in semiconductor process according to claim 10, wherein said focus ring is made of quartz.

12. The apparatus for supporting the wafer in semiconductor process according to claim 10, wherein said focus ring is made of silicon.

13. The apparatus for supporting the wafer in semiconductor process according to claim 10, wherein said focus ring is made of ceramic.

14. The apparatus for supporting the wafer in semiconductor process according to claim 10, wherein said focus ring is made of polyimide.

15. The apparatus for supporting the wafer in semiconductor process according to claim 10, wherein said conductive material is made of silicon.

16. The apparatus for supporting the wafer in semiconductor process according to claim 10, wherein said conductive material is made of carbon.

17. The apparatus for supporting the wafer in semiconductor process according to claim 10, wherein said conductive material is made of aluminum.

18. The apparatus for supporting the wafer in semiconductor process according to claim 10, wherein said drive apparatus is a step motor.

* * * * *